(12) United States Patent
Bennett et al.

(10) Patent No.: US 6,853,264 B2
(45) Date of Patent: Feb. 8, 2005

(54) INPUT POWER LIMITER FOR A MICROWAVE RECEIVER

(75) Inventors: Jeffrey H. Bennett, Kanata (CA); Yuanfei Cen, Ottawa (CA)

(73) Assignee: Nortel Networks Limited, St. Laurent (CA)

( * ) Notice: Subject to any disclaimer, the term of this patent is extended or adjusted under 35 U.S.C. 154(b) by 0 days.

(21) Appl. No.: 10/801,667

(22) Filed: Mar. 17, 2004

(65) Prior Publication Data

US 2004/0174226 A1 Sep. 9, 2004

Related U.S. Application Data

(62) Division of application No. 09/865,680, filed on May 29, 2001.

(51) Int. Cl.[7] ................................................. H03H 7/24
(52) U.S. Cl. ....................... 333/17.2; 333/34; 333/81 R; 327/309
(58) Field of Search ....................... 333/17.2, 34, 81 R; 327/310, 309

(56) References Cited

U.S. PATENT DOCUMENTS 5,445,985 A * 8/1995 Calviello et al. ............ 438/171

* cited by examiner

Primary Examiner—Stephen E. Jones

(57) ABSTRACT

A power limiter for limiting power of high frequency signals at an input to a receiver comprises a plurality of transmission line sections connected in succession. Each section has a series inductance coupling an input to an output of the section, and a shunt capacitance constituted by capacitance of at least one pair of oppositely-poled Schottky diodes coupled at the output of the section to limit voltage of the signal at the output. Individual diodes can be replaced by series-connected diodes, or by an array of parallel and series-connected diodes, in different sections for improved performance of the limiter. The limiter can be integrated with a GaAs low noise amplifier of the receiver.

11 Claims, 2 Drawing Sheets

INPUT POWER LIMITER FOR A MICROWAVE RECEIVER

CROSS-REFERENCE TO RELATED APPLICATION

This application is a divisional of application Ser. No. 09/865,680 filed May 29, 2001.

FIELD OF THE INVENTION

This invention relates to high frequency, for example microwave, input signal power limiters for limiting input signal and interference power to an input of a receiver, such as a radar receiver or a receiver of a wireless communications system.

BACKGROUND

It is well known to provide a low noise amplifier (LNA) at an input of a high frequency, e.g. microwave, receiver in order to amplify small signals which are desired to be received. It is also well known to provide, at an input to the LNA, a microwave power limiter which serves to limit the power of signals and interference which may be supplied to the LNA, in order to protect the LNA from damage which may otherwise be caused by an excessive input power.

For example, in a radar system an output of a transmit high power amplifier (HPA) may be coupled via a circulator to an antenna, and the antenna may be coupled via the circulator and a microwave power limiter to the input of the receiver LNA. The microwave power limiter serves to protect the LNA from excessive input power, either coupled from the HPA (for example by reflection from the antenna) or received via the antenna from another transmitter.

Typically, the microwave power limiter comprises a PIN (P-type, intrinsic, N-type semiconductor) diode, or a plurality of PIN diodes coupled via a transmission line. At microwave frequencies, the recombination time of carriers in the intrinsic semiconductor region of a PIN diode is much greater than the microwave signal cycle time, so that the PIN diode has a slow turn-off time and presents a low resistance to a microwave signal having excessive power.

Consequently, such a microwave power limiter can be very effective, but it involves disadvantages of a high cost and significant space, being assembled from discrete components typically using an epitaxial silicon semiconductor process, and loss can be introduced at the interface between the limiter and the LNA.

The LNA is typically implemented using a GaAs (Gallium Arsenide) MESFET (metal-semiconductor field effect transistor) or GaAs HEMT (high electron mobility transistor) integrated circuit. It would be desirable to integrate the microwave power limiter with the LNA, but this is not practical with epitaxial silicon PIN diodes.

A process-compatible planar GaAs PIN diode has been proposed using selective implantation of P-type and N-type regions in a GaAs semiconductor material. However, this provides a lateral arrangement (rather than a vertical arrangement as in the epitaxial silicon PIN diode) which has the disadvantages of requiring close spacing of the implanted regions, and hence a high resolution, and leakage of carriers from the intrinsic semiconductor between the implanted regions into the remainder of the substrate. Further, the implanted P-type region in this case uses zinc, which creates other problems for combined fabrication processes for MESFETs and HBTs (heterojunction bipolar transistors).

It is also known that Schottky diodes are intrinsic to the MESFET and HEMT processes. A Schottky diode can comprise a metal electrode over an $N^-$ region in a GaAs substrate, a depletion region being formed beneath the electrode. A Schottky diode provides a low forward voltage and low resistance, so that it can pass a high current, and has a fast response because there is little charge storage. The fast response of the Schottky diode makes it unsuitable as a replacement for a PIN diode in a microwave power limiter.

It is also known to use diodes, which may be Schottky diodes, for voltage clipping at an input to an FET circuit. For example, an input terminal may be coupled to an input of the FET circuit via a series resistance, and a diode may be connected between the input of the FET circuit and each of its supply voltage rails, to limit voltage swing at the input of the FET circuit to the supply voltages plus the forward voltage drops of the diodes.

Such an arrangement is unsuitable for use at high frequencies, for example of 1 GHz or more, because the capacitance of the diodes in combination with the series resistance introduces a signal distortion and a loss which are not acceptable (as well as a delay which may be acceptable). In addition, such an arrangement constitutes a voltage limiter or clipper, rather than a power limiter.

Thus there is a need to provide an improved power limiter for high frequency, e.g. microwave, signals.

SUMMARY OF THE INVENTION

According to one aspect of this invention there is provided a power limiter comprising input terminals and a transmission line arranged to couple a high frequency signal supplied to the input terminals to an output of the limiter, the transmission line comprising a plurality of successive transmission line sections each comprising at least a series inductance and a shunt capacitance, the shunt capacitance comprising a capacitance of at least one diode connected to an output of the respective transmission line section to limit voltage of said signal at said output of the respective transmission line section.

Different ones of the transmission line sections can have different numbers of series-connected diodes constituting said at least one diode of the respective transmission line sections, said numbers decreasing from the input terminals towards the output of the limiter, to provide limiting at different voltage levels at the different transmission line sections. The series-connected diodes can advantageously be replaced by an array, for example a square array, of a plurality of parallel-connected sets of diodes, each set comprising a plurality of diodes connected in series.

In each case the at least one diode can comprise at least two oppositely poled diodes connected in parallel at the output of the respective transmission line section, for limiting signals of either polarity.

In a particular embodiment of the invention described below, the power limiter has four transmission line sections with, respectively a square array of 16 diodes, a square array of 9 diodes, a square array of 4 diodes, and 1 diode constituting each of said at least two oppositely poled diodes of the respective transmission line sections.

Each diode can conveniently comprise a MESFET having a source and drain connected together.

The invention also provides an integrated circuit device, for example a gallium arsenide integrated circuit device, comprising a limiter as recited above and a high frequency circuit, for example an amplifier, having an input coupled to the output of the limiter.

Another aspect of the invention provides a high frequency signal power limiter comprising a plurality of transmission line sections connected in succession, each transmission line section comprising: two input connections; two output connections; at least one inductance coupling the two input connections to the two output connections; and at least two oppositely-poled diodes coupled between the two output connections.

For example, each of said at least two oppositely poled diodes of each of the successive transmission line sections except a last one of the successive transmission line sections can comprise a plurality of diodes connected in series, a number of said plurality of diodes connected in series decreasing for the successive transmission line sections towards said last one of the successive transmission line sections. Each plurality of diodes connected in series can advantageously be replaced by an array, for example a square array, of a plurality of parallel-connected sets of diodes, each set comprising a plurality of diodes connected in series.

Another aspect of the invention provides a limiter comprising a plurality of transmission line sections connected in succession, each transmission line section comprising at least one series inductance coupling an input to an output of the transmission line section, and at least one shunt diode coupled at the output of the transmission line section to limit voltage of said signal at said output.

BRIEF DESCRIPTION OF THE DRAWINGS

The invention will be further understood from the following description by way of example with reference to the accompanying drawings, in which the same references are used in different figures to denote similar elements and in which.

DETAILED DESCRIPTION

Figure 1:
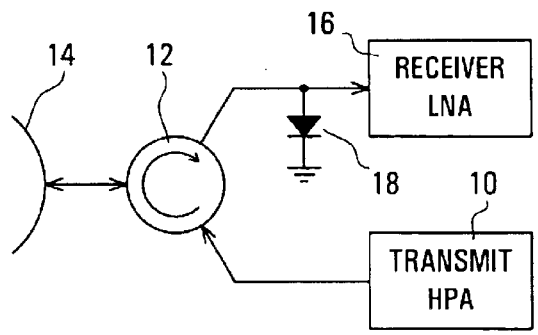
FIG. 1 illustrates a known microwave transmitter and receiver arrangement.

Referring to the drawings, FIG. 1 illustrates a microwave transmitter and receiver arrangement, for example for a radar system, in which an output of a transmit high power amplifier (HPA) 10 is coupled via a circulator 12 to an antenna 14. Signals received via the antenna 14 are coupled via the circulator 12 to an input of a receiver low noise amplifier (LNA) 16. In order to protect the LNA 16 from damage due to excessive power microwave signals and interference being supplied to its input, either by reflection by the antenna 14 of a signal from the HPA 10 or, especially, transmitted from some other transmitter, a microwave power limiter is connected at the input of the LNA 16.

As shown in the arrangement of FIG. 1, the microwave power limiter is constituted by a PIN diode 18 connected between the input of the LNA 16 and ground. As discussed above, such a microwave power limiter has the disadvantages of high cost, space requirements, and potential loss at its interface with the LNA 16. Integrated manufacture of such a microwave power limiter with the LNA 16 is not practical.

Figure 2:
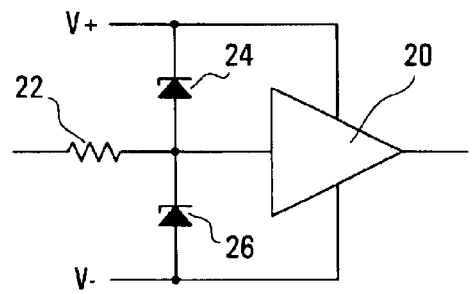
FIG. 2 illustrates a known amplifier input voltage clipping circuit arrangement.

FIG. 2 illustrates a known amplifier input voltage clipping circuit arrangement, in which an amplifier 20 operates from supply voltages V+ and −V. In order to limit input voltages supplied to the amplifier 20 to substantially the voltage range from −V to V+, an input of the amplifier arrangement is coupled to the input of the amplifier 20 via a clipping circuit which comprises a series input resistor 22 and two diodes 24 and 26, each connected between the input of the amplifier 20 and a respective one of the supply voltage rails with a polarity to be reverse biased in normal operation.

In the arrangement of FIG. 2, an excessively positive or negative voltage applied to the input forward biases the diode 24 or 26 respectively, so that voltages supplied to the input of the amplifier 20 are limited to a safe range from $(-V-V_d)$ to $(V++V_d)$, where $V_d$ is a forward voltage drop of the diodes 24 and 26. This forward voltage drop $V_d$ is relatively small if the diodes 24 and 26 are Schottky diodes as illustrated in FIG. 2.

As discussed above, the arrangement of FIG. 2 serves to limit or clip input voltages to the amplifier 20, rather than limiting input power. In addition, this arrangement is unsuitable for use at high frequencies, due to an unacceptable signal distortion and loss which occur as a result of capacitance of the diodes 24 and 26 and the series resistance 22.

Figure 3:
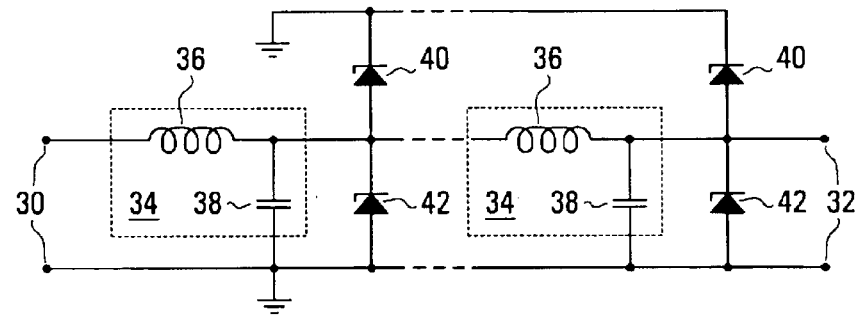
FIG. 3 shows a microwave power limiter illustrating a principle of embodiments of the invention.

FIG. 3 shows a microwave power limiter illustrating a principle of embodiments of the invention, having signal and ground input terminals 30, and signal and ground output terminals 32. In the context of the arrangement of FIG. 1, the microwave power limiter of FIG. 3 would have its input terminals 30 coupled to the receive signal output of the circulator 12 and its output terminals 32 coupled to the input of the LNA 16, replacing the PIN diode 18, and would conveniently be integrated with the LNA 16.

The microwave power limiter of FIG. 3 comprises a plurality of transmission line sections 34, only two of which are shown for simplicity, each illustrated as comprising a series inductance 36 and a shunt capacitance 38, which are coupled in series between the input terminals 30 and the output terminals 32. In addition, the microwave power limiter of FIG. 3 comprises a plurality of pairs of Schottky diodes 40 and 42, connected with opposite polarities each between the signal and ground outputs of a respective one of the transmission line sections 34.

It can be appreciated that, for each transmission line section 34, the diodes 40 and 42 are connected with opposite polarities in parallel with the capacitance 38, so that their capacitances can be considered commonly as a capacitance of the transmission line section.

In preferred implementations of the microwave power limiter, the capacitance of each transmission line section is constituted entirely by the capacitance of the diodes, and no additional capacitance 38 is provided. Consequently, the microwave power limiter of FIG. 3 is simplified to a more desirable form as shown in FIG. 4, in which the separate capacitances 38 are omitted.

Thus in accordance with the principle and a practical form of embodiments of the invention, the capacitances of the Schottky diodes 40 and 42 are incorporated into the capacitance elements of a transmission line comprising a plurality of transmission line sections. The inductances 36 can be selected accordingly to provide a desired bandwidth of the transmission line for the frequency of the desired received signal. Problems of phase shift due to capacitance of the diodes 40 and 42 are thereby reduced or avoided, provided that each transmission line section has a relatively small phase shift, i.e. that the number of transmission line sections 34 is sufficient. In practice, there may be two, three, or four or more transmission line sections 34.

The Schottky diodes 40 and 42 limit signal voltage at the output of each transmission line section 34 to the forward voltage drop of the diodes, which as described above can be quite small, so that excessive signal and interference voltages are clipped. A desired received signal has peak voltages less than this diode forward voltage drop, so that it is passed by the microwave power limiter with an acceptable delay, for example about 0.1 ns, due to the transmission line and with only a small loss, for example about 1 dB, due to the diodes 40 and 42. Consequently, the arrangement constitutes an effective microwave power limiter.

Figure 4:
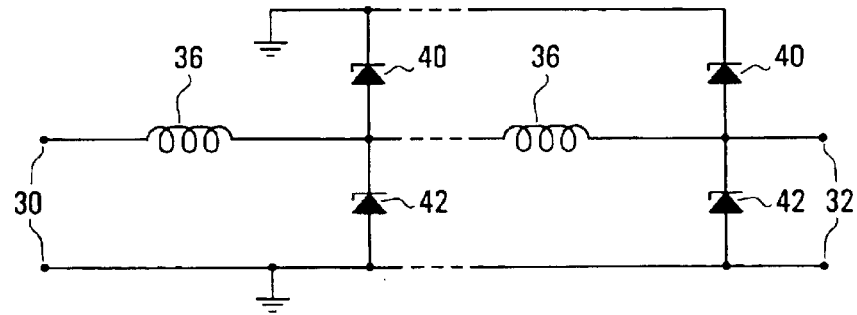
FIG. 4 illustrates parts of a microwave power limiter in accordance with an embodiment of the invention.

It can be appreciated, however, that in the microwave power limiters of FIGS. 3 and 4 most of the limiting process occurs at the output of the first transmission line section 34; thus the diodes 40 and 42 closest to the input terminals 30 limit the signal voltage to the forward voltage drop of the diodes, and subsequent diodes 40 and 42 provide little or no limiting.

In order to improve upon this situation, the effective forward voltage drops of the diodes 40 and 42 at the outputs of the respective transmission line sections 34 may be different for different transmission line sections. In particular, relatively small diode forward voltage drops may be provided for the last transmission line section closest to the output terminals 32, and progressively higher diode forward voltage drops may be provided for the successively preceding transmission line sections 34, with highest forward voltage drops being provided for the first transmission line section closest to the input terminals 30.

This is most conveniently achieved by replacing the individual diodes 40 and 42, for example at the output of each transmission line section except the last one, by a respective plurality of diodes in series.

A consequence of connecting a plurality of diodes in series is that the capacitance of the series-connected diodes is reduced. Consequently, it would be desirable to use different inductances 36 for the different transmission line sections. It may be desirable for all of the inductances 36 to be similar, which implies that the diode capacitances of all of the transmission line sections should also be similar. This can be achieved with series-connected diodes by connecting a similar plurality of sets of series-connected diodes in parallel in a square array of diodes, for example as described below.

Figure 5:
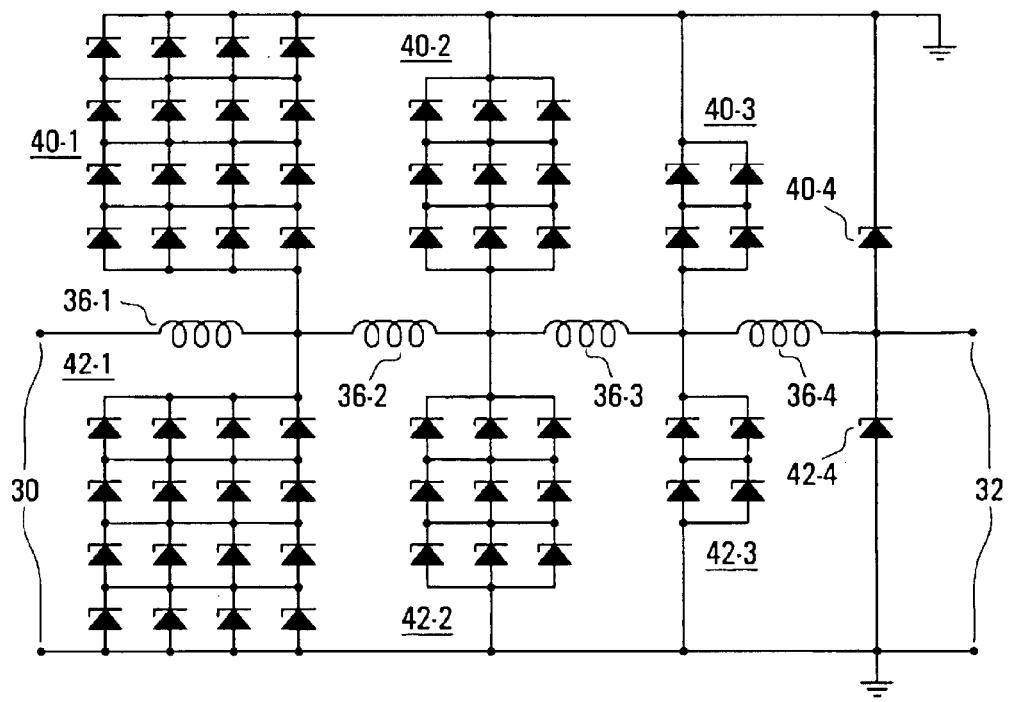
FIG. 5 illustrates a microwave power limiter in accordance with an advantageous embodiment of the invention.

By way of example, FIG. 5 illustrates a microwave power limiter having four transmission line sections between the input terminals 30 and the output terminals 32. The fourth or last section, closest to the output terminals 32, comprises an inductance 36-4 and individual Schottky diodes 40-4 and 42-4 as described above for the inductance 36 and diodes 40 and 42 of each transmission line section 34 of the limiter of FIG. 3.

In the microwave power limiter of FIG. 5, the third transmission line section comprises an inductance 36-3 which is similar to the inductance 36-4 and, in place of individual Schottky diodes 40 and 42, in each case a square array of four Schottky diodes 40-3 and 42-3 arranged in two parallel sets each of two series-connected diodes. Consequently, each array of four series-parallel diodes provides twice the total forward voltage drop, and the same total diode capacitance, as an individual Schottky diode.

The second transmission line section in the microwave power limiter of FIG. 5 similarly comprises an inductance 36-2 which is similar to the inductances 36-3 and 36-4 and, in place of individual Schottky diodes 40 and 42, in each case a square array of nine Schottky diodes 40-2 and 42-2 arranged in three parallel sets each of three series-connected diodes. Consequently, each array of nine series-parallel diodes provides three times the total forward voltage drop, and the same total diode capacitance, as an individual Schottky diode.

The first transmission line section in the microwave power limiter of FIG. 5 similarly comprises an inductance 36-1 which is similar to the inductances 36-2 to 36-4 and, in place of individual Schottky diodes 40 and 42, in each case a square array of sixteen Schottky diodes 40-1 and 42-1 arranged in four parallel sets each of four series-connected diodes. Consequently, each array of sixteen series-parallel diodes provides four times the total forward voltage drop, and the same total diode capacitance, as an individual Schottky diode.

With the microwave power limiter of FIG. 5, progressively increasing excessive signal voltages are limited by the diodes of successively the fourth to first transmission line sections, so that the limiting function is distributed among all of the diodes. Because relatively large excessive signal voltages are accommodated by the series-connected diodes, it can be appreciated that these voltages can be greater than a limit imposed by semiconductor processes used for manufacture of the limiter.

The diode arrays not only provide a higher total forward voltage drop as the size of the array is increased, but also can pass a proportionally higher current due to the parallel series-connected diodes. The total resistance of each array of parallel series-connected diodes when conducting is the same as the conductive resistance of a single diode. It can be appreciated that, in addition to and/or instead of providing parallel arrays of series-connected diodes, the diodes can be scaled using known scaling techniques.

The microwave power limiter of FIG. 5 (and the limiters of FIGS. 3 and 4 and other preferred embodiments of the invention) does not include any series resistance elements, other than the low resistance inherent in the inductances 36. Input current is limited by the series inductances and the voltage clamping action of the diodes. At high levels of input power the microwave power limiter appears to the signal source as a virtual short circuit. Most of the input power is reflected back to the source and does not need to be dissipated in the limiter itself. Consequently, the microwave power limiter can have a small size while still providing a high threshold to damage from very high input signal power.

Although in the microwave power limiter of FIG. 5 the diode arrays are square (e.g. four by four diodes in parallel and series), this need not be the case and other arrangements of series and/or parallel diodes may be provided. In addition, although in the limiter of FIG. 5 each transmission line section has a differently-sized diode array, and there is a difference of one in the number of series-connected diodes in successive sections, these need not be the case and other arrangements are possible to suit particular requirements or to optimize performance of the limiter. In particular, a rate of decrease in the number of series-connected diodes from one transmission line section to the next can be chosen to provide an optimum dissipation of power throughout the limiter. Considered generally, microwave power limiters in accordance with the invention can have any number of diodes, in any parallel and/or series combination, for each transmission line section.

Furthermore, although the limiters of FIGS. 3 to 5 provide oppositely poled diodes, or sets of diodes, for limiting both polarities of a signal, this need not be the case if limiting is required for only one signal polarity.

Although the microwave power limiter of FIG. 5 uses a large number of diodes as well as the inductances 36-1 to 36-4, it should be appreciated that these can be provided in a very small space and can easily be integrated with the LNA 16. For example, a LNA 16 implemented as a GaAs integrated circuit may require a chip area of about 3 by 2 mm. A microwave power limiter for example as described above with reference to FIG. 5 can be integrated with such a LNA, including printed inductors for the inductances 36-1 to 36-4, requiring a total GaAs chip area for the LNA and limiter of about 4.5 by 2 mm. Thus the microwave power limiter can be provided in a very convenient manner, at relatively low cost, and in a small space, and without potential loss at the interface to the LNA.

Parts or all of one or more of the inductances 36-1 to 36-4 may alternatively be constituted by the inductances of bonding wires.

Although as described above each transmission line section 34 is unbalanced, i.e. it has a single inductance 36 in a signal path and a direct connection in a ground path between the inputs and outputs of the respective section, each transmission line section could instead be balanced, with differential input and output terminals coupled via two differential signal paths each of which includes a respective series inductance component, the diodes 40 and 42 being connected with opposite polarity between the two differential outputs of the respective section.

Although Schottky diodes are described above, it can be appreciated that the same comments apply for any diodes having a fast response, as distinct from the slow turn-off of PIN diodes.

Figure 6:
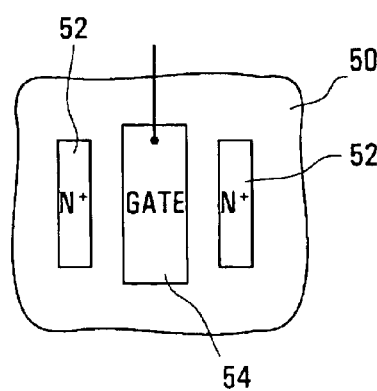
FIG. 6 is a diagram illustrating a form of diode in a microwave power limiter in accordance with embodiments of the invention.
Figure 7:
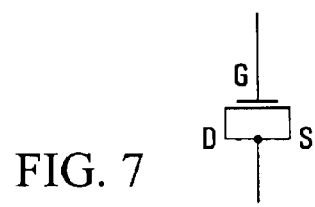
FIG. 7 shows a circuit diagram equivalent of the diode of FIG. 6.

Further, it can be appreciated that in a MESFET process each Schottky diode as described above can be, and desirably is, constituted by a MESFET with its drain and source interconnected. FIG. 6 illustrates a corresponding physical form of each diode, and FIG. 7 shows an equivalent circuit diagram.

Referring to FIG. 6, a GaAs semiconductor 50 has $N^+$ semiconductor regions 52 on each side of a metal gate electrode 54 to which a gate connection is illustrated. The $N^+$ regions 52 constitute a drain and source of a resulting MESFET, to which electrodes (not shown in FIG. 6) are applied in known manner. As shown in FIG. 7, these drain (D) and source (S) electrodes are connected together to form one terminal, and the gate (G) of the MESFET forms another terminal, of the resulting diode.

Figure 8:
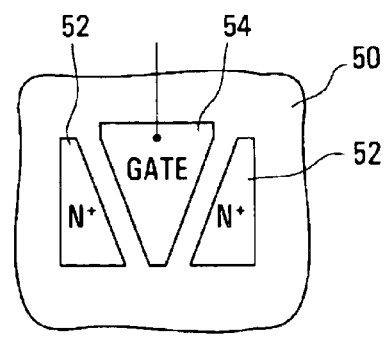
FIG. 8 is a diagram illustrating another form of diode in a microwave power limiter in accordance with embodiments of the invention.

FIG. 8 is similar to FIG. 6 but illustrates an alternative physical form of the diode-connected MESFET, in which the gate electrode 54 is tapered in order to provide a decreased resistance, and each of the $N^+$ regions 52 has a complementary taper.

Although as described above the microwave power limiter is provided in the input circuit of a LNA, it could similarly be provided for protection of, and/or can be integrated with, any other kind of circuit, for example a mixer or an analog-to-digital signal converter. Furthermore, although the above description relates primarily to GaAs MESFET technology, the microwave power limiter can alternatively be implemented using any other technology which enables the diodes and inductances to be provided, including for example GaAS HEMT, InP, GaN Ge, and silicon technologies.

Thus although particular embodiments of the invention and variations have been described above in detail, it can be appreciated that these and numerous other modifications, variations, and adaptations may be made without departing from the scope of the invention as defined in the claims.

What is claimed is:

1. A limiter for limiting a high frequency signal, comprising a plurality of transmission line sections connected in succession, each transmission line section comprising at least one series inductance coupling an input to an output of the transmission line section, and two oppositely-poled parallel-connected shunt diode arrays coupled at the output of the transmission line section to limit voltage of said signal at said output;

wherein the diode arrays comprise different numbers of diodes, connected in series, with the number of series diodes of the arrays decreasing progressively for the plurality of transmission line sections from an input of the limiter to an output of the limiter.

2. A limiter as claimed in claim 1 wherein the diode arrays further comprise a plurality of diodes connected in parallel.

3. A limiter as claimed in claim 1 wherein each diode array comprises a square array of diodes.

4. A limiter as claimed in claim 1 wherein each diode comprises a MESFET having a source and drain connected together.

5. A gallium arsenide integrated circuit comprising a limiter as claimed in claim 1 and a high frequency circuit having an input coupled to an output of the limiter.

6. A power limiter comprising input terminals and a transmission line arranged to couple a high frequency signal supplied to the input terminals to an output of the power limiter, the transmission line comprising a plurality of successive transmission line sections, each transmission line section comprising at least a series inductance and a shunt capacitance, the shunt capacitance comprising a capacitance of at least two oppositely poled diodes connected in parallel to an output of the respective transmission line section to limit voltage of said signal at said output of the respective transmission line section, wherein at least two of the transmission line sections have different numbers, decreasing from said input terminals towards said output of the power limiter, of diodes connected in series with one another and constituting each of said at least two oppositely poled diodes of the respective transmission line sections.

7. A limiter as claimed in claim 6 wherein said diodes connected in series with one another comprise an array of a plurality of parallel-connected sets of diodes, each set comprising a plurality of diodes connected in series.

8. A limiter as claimed in claim 6 wherein each diode comprises a MESFET having a source and drain connected together.

9. An integrated circuit device comprising a limiter as claimed in claim 6 and a high frequency circuit having an input coupled to the output of the limiter.

10. An integrated circuit device as claimed in claim 9 wherein the high frequency circuit comprises an amplifier.

11. An integrated circuit device as claimed in claim 9 wherein the device comprises a gallium arsenide integrated circuit device.

* * * * *